US009249606B2

(12) United States Patent
Naka

(10) Patent No.: US 9,249,606 B2
(45) Date of Patent: Feb. 2, 2016

(54) ANTENNA UNIT AND DOOR HANDLE DEVICE INCLUDING THE SAME

(75) Inventor: Atsushi Naka, Hiroshima-ken (JP)

(73) Assignee: U-SHIN LTD., Tokyo (JP)

( * ) Notice: Subject to any disclaimer, the term of this patent is extended or adjusted under 35 U.S.C. 154(b) by 90 days.

(21) Appl. No.: 13/306,461

(22) Filed: Nov. 29, 2011

(65) Prior Publication Data

US 2012/0133563 A1 May 31, 2012

(30) Foreign Application Priority Data

Nov. 29, 2010 (JP) ................................. 2010-264626

(51) Int. Cl.

| | |
|---|---|
| ***H01Q 1/24*** | (2006.01) |
| ***H01Q 1/32*** | (2006.01) |
| ***H03K 17/975*** | (2006.01) |
| ***B60R 25/00*** | (2013.01) |
| ***G08B 13/26*** | (2006.01) |
| ***B60R 25/10*** | (2013.01) |
| ***H01R 33/00*** | (2006.01) |
| ***E05B 81/78*** | (2014.01) |
| ***H01Q 7/08*** | (2006.01) |

(52) U.S. Cl.

CPC ................. *E05B 81/78* (2013.01); *E05B 81/77* (2013.01); *H01Q 1/3283* (2013.01); *H01Q 1/3291* (2013.01); *H01Q 7/08* (2013.01)

(58) Field of Classification Search

CPC ........................................................ H01Q 1/32
USPC .......................................................... 343/713
See application file for complete search history.

(56) References Cited

U.S. PATENT DOCUMENTS

| | | | | |
|---|---|---|---|---|
| 6,740,834 | B2 * | 5/2004 | Sueyoshi et al. | 200/600 |
| 7,029,054 | B2 * | 4/2006 | Kobayashi et al. | 296/146.1 |
| 7,132,768 | B2 * | 11/2006 | Ieda et al. | 307/652 |
| 7,192,285 | B2 * | 3/2007 | Makino et al. | 439/34 |
| 7,199,317 | B2 * | 4/2007 | Ieda et al. | 200/61.62 |
| 7,548,210 | B2 * | 6/2009 | Hashiguchi et al. | 343/713 |
| 2003/0128116 | A1 * | 7/2003 | Ieda et al. | 340/562 |
| 2004/0222804 | A1 * | 11/2004 | Inuzuka et al. | 324/690 |
| 2005/0230237 | A1 * | 10/2005 | Ieda et al. | 200/600 |
| 2007/0075828 | A1 * | 4/2007 | Mizushima et al. | 340/5.62 |
| 2010/0237635 | A1 * | 9/2010 | Ieda et al. | 292/336.3 |

* cited by examiner

*Primary Examiner* — Dameon E Levi
*Assistant Examiner* — Ricardo Magallanes
(74) *Attorney, Agent, or Firm* — Westerman, Hattori, Daniels & Adrian, LLP

(57) ABSTRACT

An antenna unit incorporated into a door handle of a vehicle includes: an unlock sensor plate (first detection electrode) of a capacitive sensor configured to detect a driver's approaching or touching the door handle; and an antenna for wireless communications. The unlock sensor plate has an antenna fixing part for positioning and fixing the antenna. The antenna fixed on the antenna fixing part and the unlock sensor plate are molded into a unit with a molded resin. The unlock sensor plate has a circuit board fixing part for positioning and fixing a circuit board including a detection circuit of the capacitive sensor mounted thereon. An electrode fixing part for positioning and fixing a lock sensor plate (a second detection electrode) of the capacitive sensor is provided on an opposite surface of the circuit board from a surface on which the unlock sensor plate is arranged.

10 Claims, 6 Drawing Sheets

ANTENNA UNIT AND DOOR HANDLE DEVICE INCLUDING THE SAME

BACKGROUND OF THE INVENTION

1. Field of the Invention

The present invention relates to an antenna unit to be incorporated into a door handle of a vehicle and a door handle device including the antenna unit.

2. Description of the Related Art

A smart entry system for enhancing the convenience in opening and closing operations of a vehicle door has recently been developed and already put in practical use. In the smart entry system, a driver who carries an electronic key incorporating a wireless device for transmitting an ID signal has only to approach or leave a vehicle for locking or unlocking a door locking device of a vehicle.

A door handle device for vehicle employing such a smart entry system is provided with: an antenna configured to transmit and receive an ID signal and the like; and a capacitive sensor (a touch sensor) configured to detect the driver's approaching or touching a door handle. When the driver carrying the electronic key touches the door handle to open the door, the capacitive sensor incorporated into the door handle detects the touch, and an authentication device of the vehicle transmits a request signal to the electronic key through an antenna. The electronic key having received the request signal transmits an ID signal including an ID code of the key to the authentication device of the vehicle. If the ID code in the received ID signal matches an ID code stored in advance, the authentication device of the vehicle having received the ID signal authenticates the electronic key and drives an actuator of the door locking device, so that the door locking device enters an unlock state in which the door is openable.

Meanwhile, Japanese Patent Application Publication No. 2003-224410 has made a proposal to enhance assembly workability by simplifying handling of an antenna while protecting the antenna. Specifically, an antenna and a detection electrode of the capacitive sensor which are provided in a door handle are integrally molded with a synthetic resin for molding.

SUMMARY OF THE INVENTION

However, the configuration proposed in Japanese Patent Application Publication No. 2003-224410 requires the antenna and the detection electrode to be set separately in a mold every time they are molded, and thus has a problem of increase in manufacturing cost due to the laborious manufacturing.

The present invention has been made in view of the above problem, and an object thereof is to provide an antenna unit achieving enhanced assembly efficiency as well as reduced manufacturing cost and a door handle device including the antenna unit.

In order to achieve the above object, a first aspect of the invention provides an antenna unit incorporated into a door handle of a vehicle, the antenna unit comprising: a first detection electrode of a capacitive sensor configured to detect a driver's approaching or touching the door handle; and an antenna for wireless communications, wherein the first detection electrode is provided with an antenna fixing part for positioning and fixing the antenna, and the antenna fixed on the antenna fixing part and the first detection electrode are integrated into a unit with a molded resin.

According to a second aspect of the invention, in the first aspect, a surface of the first detection electrode is coated with an insulative coating film.

In the first or second aspect, a third aspect of the invention further comprises: a circuit board on which a detection circuit of the capacitive sensor is mounted; and a second detection electrode of the capacitive sensor, wherein the first detection electrode is provided with a circuit board fixing part for positioning and fixing the circuit board, and an electrode fixing part for positioning and fixing the second detection electrode is provided on an opposite surface of the circuit board from a surface on which the first detection electrode is arranged.

According to a fourth aspect of the invention, in the third aspect, the first detection electrode is provided with a harness holding part for holding a harness connected to the circuit board.

A door handle device of a fifth aspect comprises the antenna unit according to any one of the first to fourth aspects which is incorporated into a door handle of a vehicle.

According to the first aspect of the invention, an assembly of the first detection electrode and the antenna fixed on the antenna fixing part of the first detection electrode is placed in the mold to be molded into a unit. The antenna and the first detection electrode do not have to be placed separately in a mold. Thus, the assembling efficiency is enhanced, and the manufacturing cost can be kept low. In addition, directly positioning and fixing the antenna on the first detection electrode eliminates an additional member such as a positioning plate, thereby reducing the number of parts and the manufacturing cost.

According to the second aspect of the invention, the surface of the first detection electrode is coated with the insulating coating film. Even though the antenna is directly fixed on the first detection electrode, electrical insulation therebetween can be ensured.

According to the third aspect of the invention, the antenna and the circuit board are positioned and fixed on the first detection electrode, and the second detection electrode is positioned and fixed on the circuit board positioned and fixed on the first detection electrode. Thus, the first and second detection electrodes, the antenna, and the circuit board are integrally assembled and placed in the mold to be resin-molded. The four components do not have to be placed separately in a mold. Consequently, the antenna unit assembling efficiency is enhanced, and the manufacturing cost is kept low. In addition, the antenna and the circuit board are directly positioned and fixed on the first detection electrode, and the second detection electrode is directly positioned and fixed on the circuit board. Thus, an additional member such as a positioning plate is not required. This reduces the number of parts, and thus can reduce the manufacturing cost.

According to the fourth aspect of the invention, at the time of assembling, the harness connected to the circuit board can be held at a certain position by the harness holding part of the first detection electrode. Thus, the harness does not hinder another electronic part from being mounted on the first detection electrode. The workability is improved, and the assembling efficiency is enhanced. In addition, the harness can be accommodated reliably in the molded resin in molding as the last step. This can reliably protect the harness and prevent damage thereto.

According to the fifth aspect of the invention, the improvement of the assembling efficiency of the antenna unit leads to the manufacturing cost reduction. Thereby, the cost reduction of the door handle device including the antenna unit incorporated therein can be achieved.

BRIEF DESCRIPTION OF THE DRAWINGS

FIG. 3A is a perspective view of a first assembly configured by attaching a lock sensor plate to a circuit board. FIG. 3B is a partial perspective view of an end portion of the first assembly viewed from the back thereof. FIG. 3C is a partial perspective view of the circuit board.

FIG. 4A is a perspective view of a second assembly configured by attaching the first assembly to an unlock sensor plate. FIG. 4B is a partial perspective view of the second assembly viewed from the back thereof. FIG. 4C is a partial perspective view of the unlock sensor plate.

FIG. 5A is a perspective view of a third assembly configured by attaching an antenna to the second assembly. FIG. 5B is a partial perspective view of a structure in which the antenna is attached to the unlock sensor plate.

FIG. 6A is a perspective view of the resin-molded antenna unit. FIG. 6B is a perspective view of the antenna unit viewed from the back thereof.

DETAILED DESCRIPTION OF THE PREFERRED EMBODIMENT

Examples of the present invention will be described below.

Figure 1:
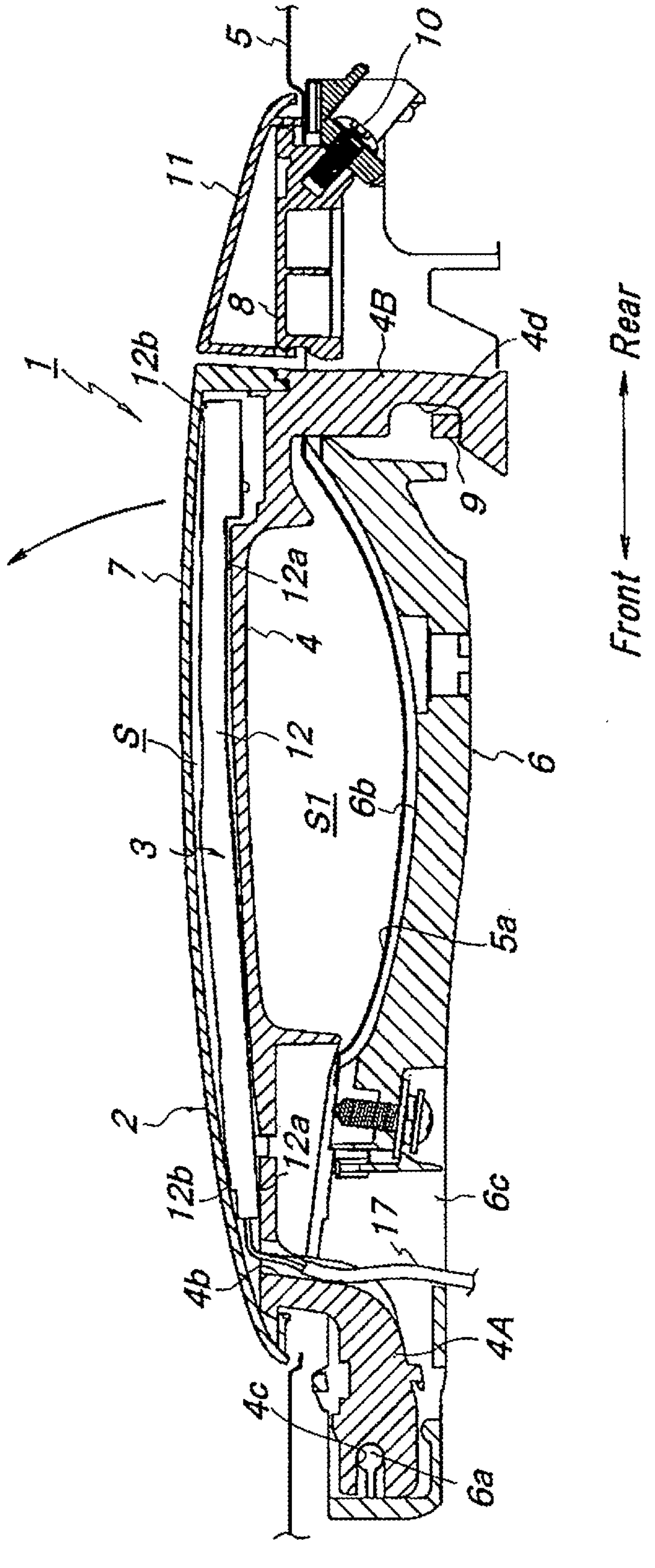
FIG. 1 is a plan cross-sectional view of a door handle device according to an embodiment of the present invention.

A door handle device 1 shown in FIG. 1 includes an antenna unit 3 (see FIGS. 6A and 6B) according to the embodiment of the invention, the antenna unit 3 being incorporated into a door handle 2 attached to a door of a vehicle. The handle 2 includes: a handle body 4 extending long in a vehicle front-rear direction (a right-left direction in FIG. 1); a handle base 6 for fixing the handle body 4 on a door panel 5; a handle cover 7 covering a surface of the handle body 4; and an outer attachment member 8 on which an unillustrated cylinder lock or the like is fixed. Note that the handle body 4, the handle base 6, the handle cover 7, and the outer attachment member 8 are all made of a resin.

Figure 2:
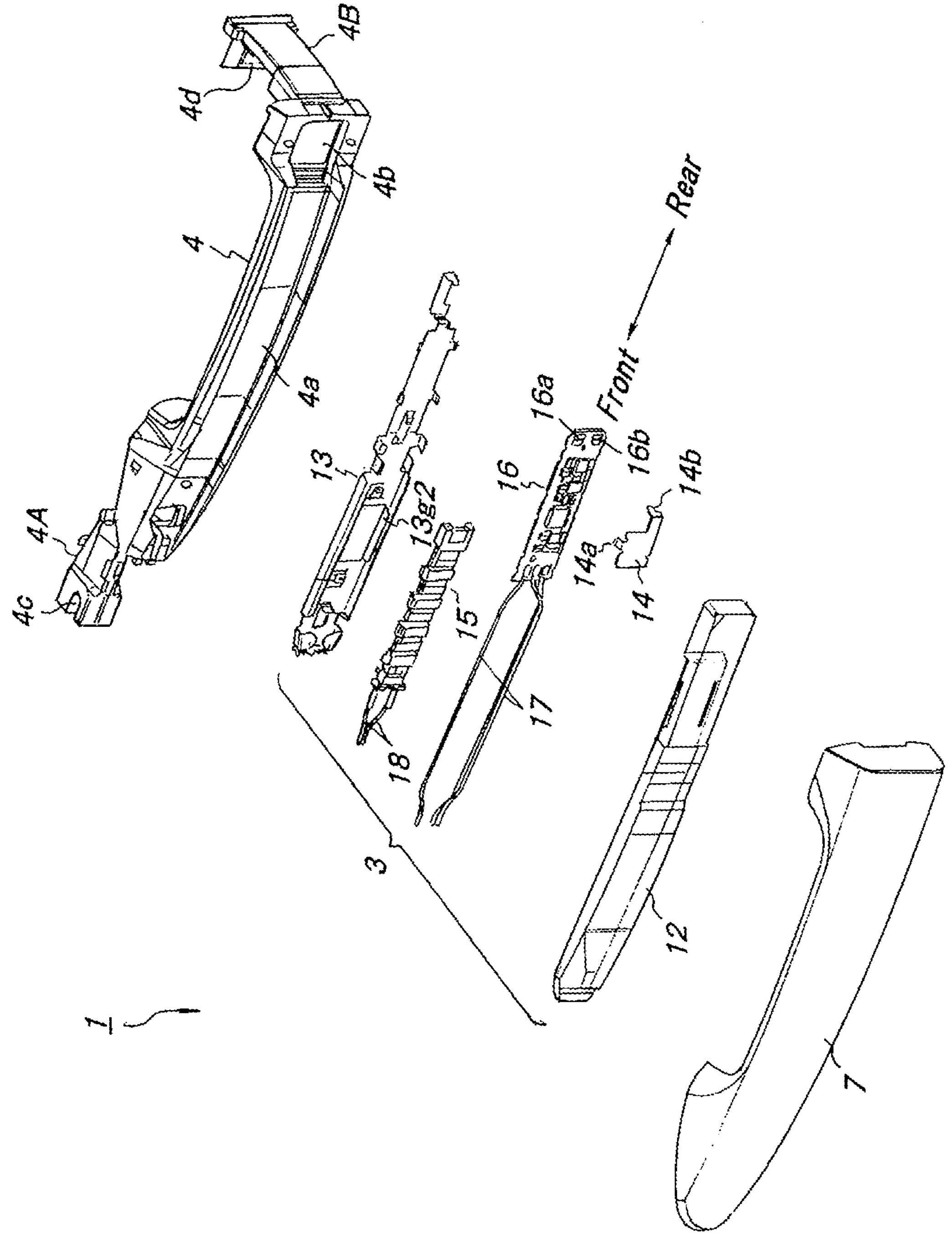
FIG. 2 is an exploded perspective view of a door handle device according to the embodiment.

The handle body 4 is integrally molded to have a U shape in a plan view. As shown in FIG. 2, a recessed part 4*a* opening outward is formed on an outer surface of the handle body 4 to extend in a longitudinal direction of the handle body 4. The recessed part 4*a* is covered with the handle cover 7, so that a space S (see FIG. 1) is formed between the recessed part 4*a* and the handle cover 7. In addition, as shown in FIG. 1, an insertion part 4*b* is formed in a front end portion of the recessed part 4*a*. Incidentally, the handle cover 7 is fastened to the handle body 4 with unillustrated vises.

An arm 4A and an operating part 4B protrude inward (toward the bottom in FIG. 1) from a front end and a rear end, respectively, of the handle body 4 (the left end and the right end in FIG. 1, respectively) to make a substantially right angle. The arm 4A has an L shape in a plan view and has a spindle hole 4*c* at its end. A spindle 6*a* formed in a front end portion of the handle base 6 is fitted into the spindle hole 4*c*. The handle body 4 can rotate around the spindle 6*a* together with the handle cover 7 in an arrow direction in FIG. 1.

A recessed locking part 4*d* is formed in the operating part 4B protruding in the rear end portion of the handle body 4, and a handle lever 9 is engaged with the recessed locking part 4*d*. Note that the handle lever 9 is provided for operating an unillustrated door lock device incorporated into a vehicle body. When the handle body 4 is operated to rotate around the spindle 6*a* of the handle base 6 in the arrow direction in FIG. 1, the movement of the operating part 4B of the handle body 4 causes the handle lever 9 to move in the same direction. This operates the door lock device to unlock the door.

As shown in FIG. 1, the handle base 6 is attached to an inner surface of the door panel 5, wherein a recess-shaped part 6*b* extending along a recess shape 5*a* of the door panel 5 is formed. A space (gap) S1 for a driver to insert his/her hand therein is formed between the recess-shaped part 6*b* and the handle body 4. The arm 4A and the operating part 4B of the handle body 4 are inserted in the handle base 6 as shown in FIG. 1. An insertion hole 6*c* for inserting the arm 4A is formed in the front end portion of the handle base 6.

The outer attachment member 8 is attached to the door panel 5 with a screw 10 and is covered with an outer cover 11.

Meanwhile, as shown in FIG. 1, the space S formed between the handle body 4 and the handle cover 7 covering the handle body 4 accommodates the antenna unit 3 integrally formed with a molded resin 12 (see FIG. 2). The antenna unit 3 is supported in such a manner that end portions (front and rear end portions) thereof in the longitudinal direction are held between the handle body 4 and the handle cover 7. Specifically, supporting protrusions 12*a* integrally formed with an inward surface (a surface on the handle body 4 side) of end portions, of the molded resin 12, in the longitudinal direction are in contact with the handle body 4, while supporting protrusions 12*b* integrally formed with an outward surface (a surface on the handle cover 7 side) are in contact with the handle cover 7. In the center portion, of the antenna unit 3, in the longitudinal direction, spaces are formed between the antenna unit 3 and the handle body 4 and between the antenna unit 3 and the handle cover 7 to prevent the antenna unit 3 from contacting inner surfaces of the handle body 4 and the handle cover 7. In other words, the end portions (front and rear end portions), of the antenna unit 3, in the longitudinal direction is supported by the support protrusions 12*a* and 12*b* integrally formed with the molded resin 12 in such a manner that the center portion, of the antenna unit 3, in the longitudinal direction is not in contact with the inner surfaces of the handle body 4 and the handle cover 7.

As shown in FIG. 2, the antenna unit 3 includes an unlock sensor plate 13 forming a first detection electrode of a capacitive sensor, a lock sensor plate 14 forming a second detection electrode of the capacitive sensor, an antenna 15, and a circuit board 16, which are assembled and then integrated into a unit with the molded resin 12.

Figures 4A, 4B, 4C:
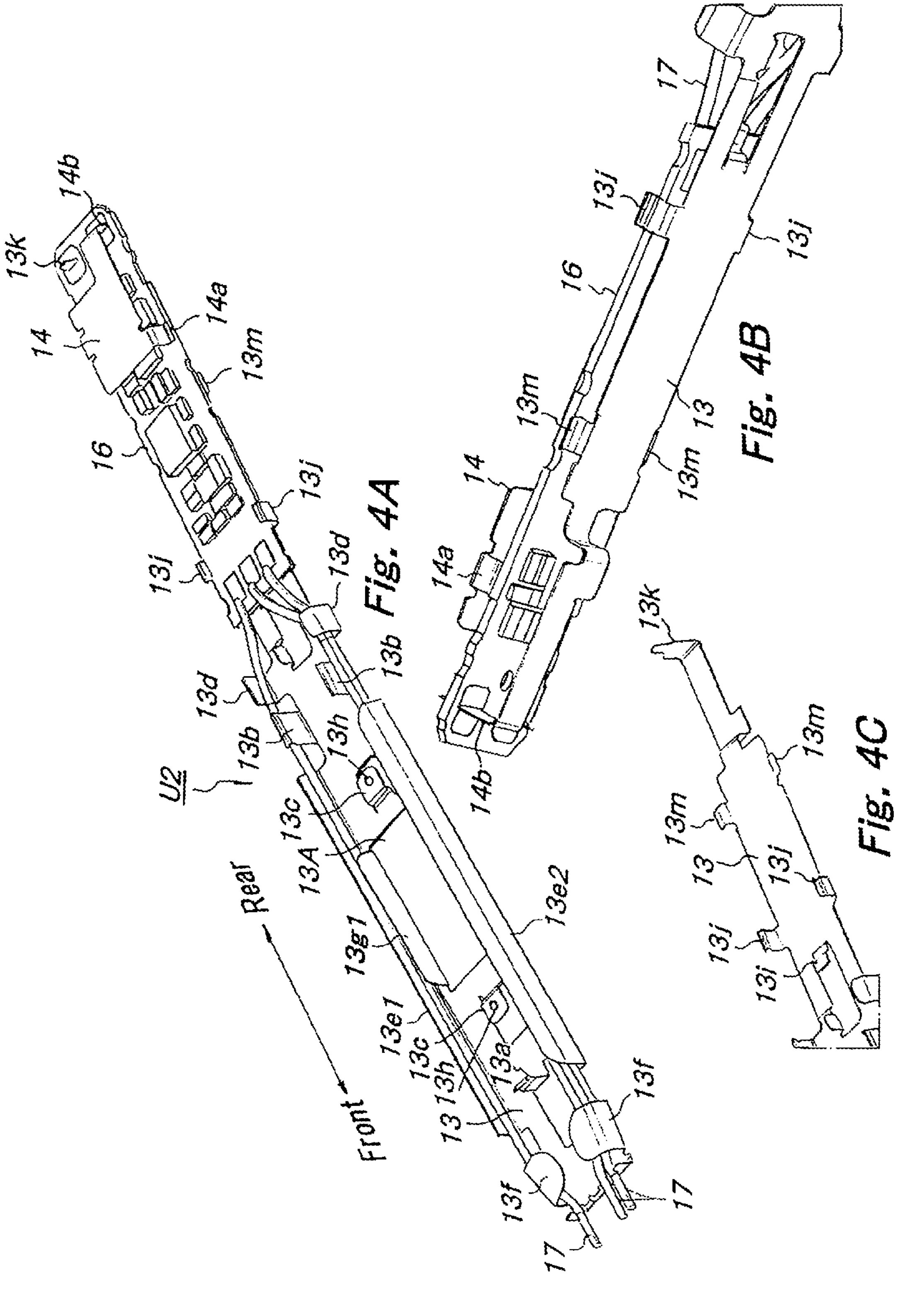
FIGS. 4A to 4C are views illustrating steps of assembling the antenna unit according to the embodiment.
Figures 5A, 5B:
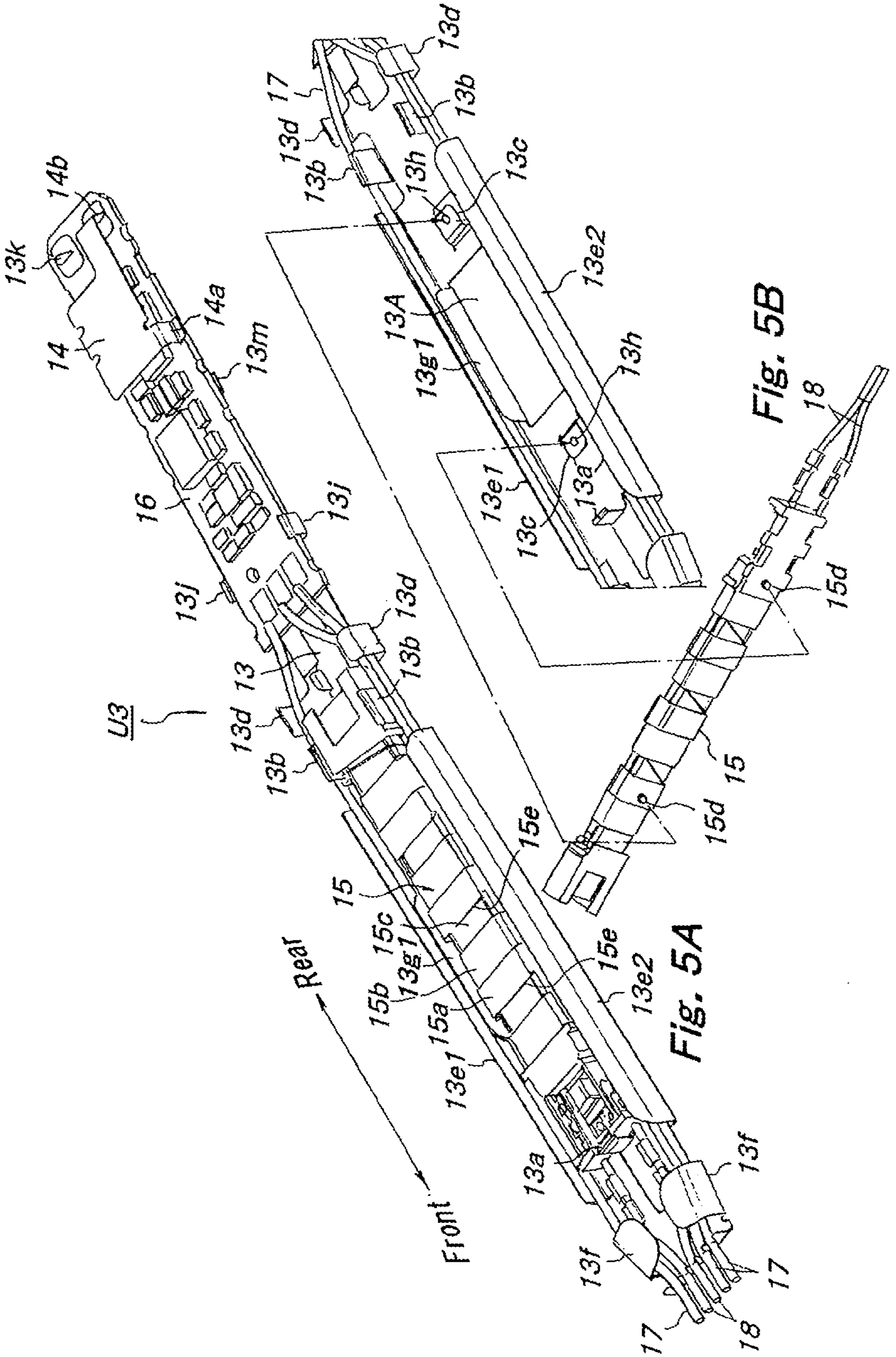
FIGS. 5A and 5B are views illustrating steps of assembling the antenna unit according to the embodiment.

When the driver inserts his/her hand into the space S1 between the handle body 4 and the handle base 6 and grabs the handle body 4 and the handle cover 7 to open the door, the unlock sensor plate 13 electromagnetically detects the grabbing due to a change of a capacitance. The unlock sensor plate 13 is formed by press molding a metal plate. A surface thereof is coated with an insulative coating film such as a cation electrocoating film. A front half portion, of the unlock sensor plate 13, in the longitudinal direction is formed by an antenna fixing part for positioning and fixing the antenna 15 and a harness holding part for holding three harnesses 17 extending from the circuit board 16. As shown in FIG. 4A and FIG. 5B, the antenna fixing part includes three locking claws 13*a*, 13*b* and two positioning plates 13*c*, while the harness holding part includes pairs of holding plates 13*d*, holding flanges 13*e*1, 13*e*2, holding pieces 13*f*, and partitioning plates 13*g*1, 13*g*2 (one of them is shown in FIG. 2) for dividing and laying out the harnesses 17 in an up-down direction (a width direction).

A square hole 13A is formed in the front half portion of the unlock sensor plate 13. The positioning plates 13*c* are formed at front and rear sides of the square hole 13A. Circular positioning holes 13*h* are formed in the plates 13*c*, respectively. In front of one of the positioning plates 13*c*, the single locking claw 13*a* is provided by being cut and bent to be upright at a right angle. Behind the other positioning plate 13*c* and in upper and lower portions of the unlock sensor plate 13, the pairs of the locking claws 13*b* and the holding plates 13*d* are provided upright at a right angle. The holding flanges 13*e*1, 13*e*2 extending in the longitudinal direction are provided upright at a right angle above and below the square hole 13A in the unlock sensor plate 13 and have ends bent inward to make an approximately right angle. Inward of the holding flanges 13*e*1, 13*e*2, the partitioning plates 13*g*1, 13*g*2 extending in the longitudinal direction are provided by being cut and bent to be upright at a right angle. One of the harnesses 17 extending from the circuit board 16 is put through between the partitioning plate 13*g*1 and the holding flange 13*e*1, while two of the harnesses 17 are put through between the partitioning plate 13*g*2 and the holding flange 13*e*2, so that the three harnesses 17 can be held.

The pair of holding pieces 13*f* are formed in a bent state in upper and lower portions of a front end portion of the unlock sensor plate 13.

Meanwhile, a rear half portion of the unlock sensor plate 13 is formed by a board fixing part for positioning and fixing the circuit board 16. As shown in FIG. 2 and FIGS. 4A to 4C, the board fixing part includes three locking claws 13*i*, 13*j*, a single connection piece 13*k*, and a pair of holding plates 13*m*. Specifically, the single locking claw 13*i* is provided by being cut and bent to be upright at a right angle in the center portion, of the unlock sensor plate 13, in the up-down direction (width direction). The pair of locking claws 13*j* are formed while being bent at a right angle in the upper and lower portions behind the locking claw 13*i*. Further behind the locking claws 13*j*, the pair of upper and lower holding plates 13*m* are formed while being bent at a right angle. Then, the connection piece 13*k* is formed while being bent at a right angle in a rear end portion of the unlock sensor plate 13.

The lock sensor plate 14 electromagnetically detects the driver's touch with the handle cover 7 based on change of capacitance. The lock sensor plate 14 is formed by press molding a metal plate. A pair of locking claws 14*a* are provided upright at a right angle in upper and lower portions of the lock sensor plate 14. A connection piece 14*b* is formed in a rear end portion of the lock sensor plate 14 while being bent at a right angle.

As shown in FIG. 5A, the antenna 15 includes: a bobbin 15*a* molded into a tubular form with a resin and wound around with coils 15*b*; and a ferrite 15*c* inserted and fixed in the bobbin 15*a*. As shown in FIG. 5B, positioning pins 15*d* protrude at ends, of the antenna 15, in the longitudinal direction. The antenna 15 includes two harnesses 18 extending therefrom. Note that the bobbin 15*a* has slits 15*e* in such a manner that both surfaces of the ferrite 15*c* can be exposed at regular intervals and are recessed inward at a lower level than a surface of the bobbin 15*a*. With this configuration, when the bobbin 15*a* is wound around with the coils 15*b* in portions of the slits 15*e*, each coil 15*b* is located at the lower and inner level than the surface of the bobbin 15*a*. Thus, the coil 15*b* can be made close to the ferrite 15*c* while high insulation properties thereof are maintained. In addition, even if a bottom portion of the bobbin 15*a* comes in contact with a surface of the unlock sensor plate 13 after the positioning pins 15*d* of the bobbin 15*a* are fitted into the positioning holes 13*h* of the positioning plates 13*c* of the unlock sensor plate 13, a malfunction can be prevented in which the coil 15*b* is damaged due to contact with the unlock sensor plate 13.

The circuit board 16 includes a detection circuit of the capacitive sensor mounted therein and also includes a pair of upper and lower slit-shaped connection holes 16*a*, 16*b* in a rear end portion of the circuit board 16. The three harnesses 17 extend from the circuit board 16. Note that upper and lower end faces of the circuit board 16 and the connection hole 16*b* form an electrode fixing part for positioning and fixing the circuit board 16.

As shown in FIG. 1, the harnesses 17 and 18 (FIG. 1 shows only the harnesses 17) extending from the circuit board 16 and the antenna 15 are bent inward the vehicle to make an approximately right angle and are drawn to the inside of the door through the insertion part 4*b* formed in the arm 4A of the handle body 4 and then the insertion hole 6*c* of the handle base 6. End portions of the harnesses 17 and 18 are electrically connected to an unillustrated ECU mounted on the vehicle body.

Next, attaching steps of the antenna unit 3 configured as above will be described below based on FIG. 3A to FIG. 6B.

Figure 3A:
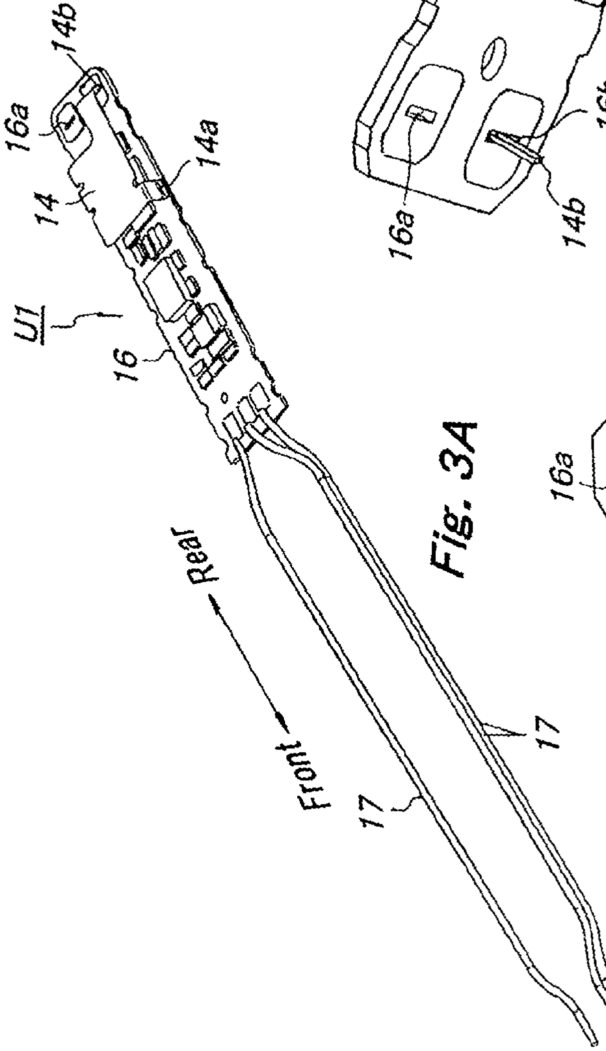
FIGS. 3A to 3C are views illustrating steps of assembling an antenna unit according to the embodiment.

Firstly, the lock sensor plate 14 is positioned and fixed on the circuit board 16 to form a first assembly U1, as shown in FIG. 3A.

Figure 3B:
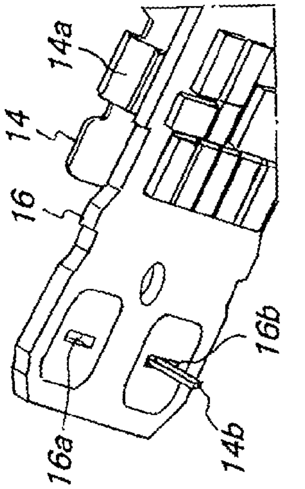
Figure 3C:
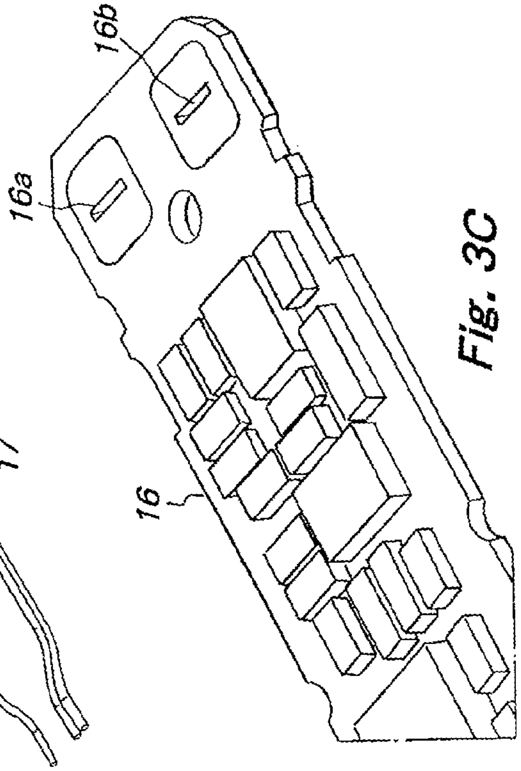

Specifically, the connection piece 14*b* formed on the rear end portion of the lock sensor plate 14 is inserted into the connection hole 16*b* in the lower portion of the circuit board 16, while the pair of upper and lower locking claws 14*a* are locked with the upper and lower end faces of the circuit board 16. Thereby, the lock sensor plate 14 is positioned and fixed. Then, by soldering a portion where the connection piece 14*b* inserted into the connection hole 16*b* protrudes from a back surface of the circuit board 16 as shown in FIG. 3B, the lock sensor plate 14 is electrically connected to the circuit board 16 to form the first assembly U1.

Next, as shown in FIG. 4A, the first assembly U1 is attached to the rear half portion of the unlock sensor plate 13 to form a second assembly U2.

Specifically, the connection piece 13*k* formed in the rear end portion of the unlock sensor plate 13 is inserted into the upper connection hole 16*a* formed in the circuit board 16 in the first assembly U1. Then, while the first assembly U1 is placed on the supporting plates 13*m* of the unlock sensor plate 13, the first assembly U1 is pushed down onto the unlock sensor plate 13. Thereby, the three locking claws 13*i*, 13*j* formed on the unlock sensor plate 13 are locked with the circuit board 16 of the first assembly U1, so that the first assembly U1 is positioned and fixed on the unlock sensor plate 13. Subsequently, as shown in FIG. 4A, by soldering a portion where the connection piece 13*k* inserted into the connection hole 16*a* protrudes from a surface of the circuit board 16, the unlock sensor plate 13 is electrically connected to the circuit board 16. Thereby, the second assembly U2 is formed in which the first assembly U1 and the unlock sensor plate 13 are integrally assembled.

When the first assembly U1 is positioned and fixed on the unlock sensor plate 13 as described above, the three harnesses 17 extending from the circuit board 16 are divided into the single harness 17 and the two harnesses 17 as shown in FIG. 4A. The single harness 17 is held by the unlock sensor plate 13 through between the upper holding plate 13*d* and the upper locking claw 13*b*, through between the upper holding flange 13*e*1 and the partitioning plate 13*g*1, and through the holding piece 13*f* at the front end of the unlock sensor plate 13. The remaining two harnesses 17 are held by the unlock sensor plate 13 through between the lower holding plate 13*d* and the lower locking claw 13*b*, through between the lower holding flange 13*e*2 and the partitioning plate 13*g*2, and through the holding piece 13*f* at the front end of the unlock sensor plate 13.

As described above, the first assembly U1 formed by attaching the lock sensor plate 14 to the circuit board 16 is attached to the unlock sensor plate 13 to form the second assembly U2, and then the antenna 15 is attached to the front half portion of the unlock sensor plate 13 which is the second assembly U2 to form a third assembly U3.

Specifically, as shown in FIG. 5B, while the positioning pins 15*d* protruding from end portions, of the antenna 15, in the longitudinal direction are positioned in the positioning holes 13*h* formed in the positioning plates 13*c* of the unlock sensor plate 13, the antenna 15 is pushed down onto the unlock sensor plate 13. As a result, the positioning pins 15*d* of the antenna 15 are fitted into the positioning holes 13*h* of the unlock sensor plate 13 to position the antenna 15 with respect to the unlock sensor plate 13, while the three locking claws 13*a*, 13*b* formed in the unlock sensor plate 13 are locked with the antenna 15 to fix the antenna 15 on the unlock sensor plate 13. Thus, the third assembly U3 shown in FIG. 5A is formed.

Figure 6A:
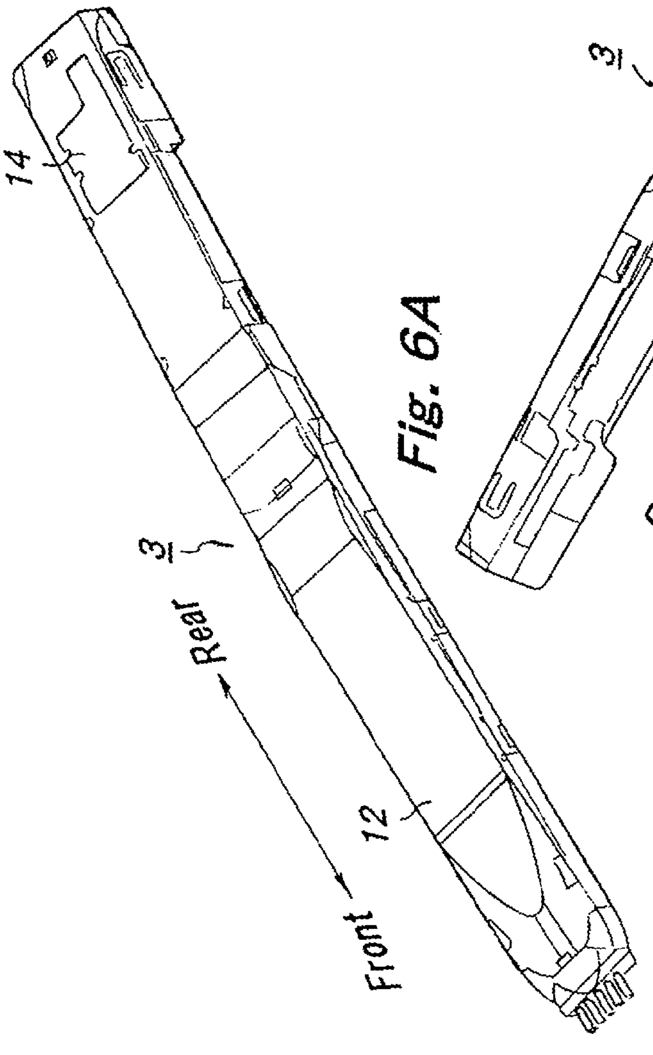
FIGS. 6A and 6B are views illustrating steps of assembling the antenna unit according to the embodiment.
Figure 6B:
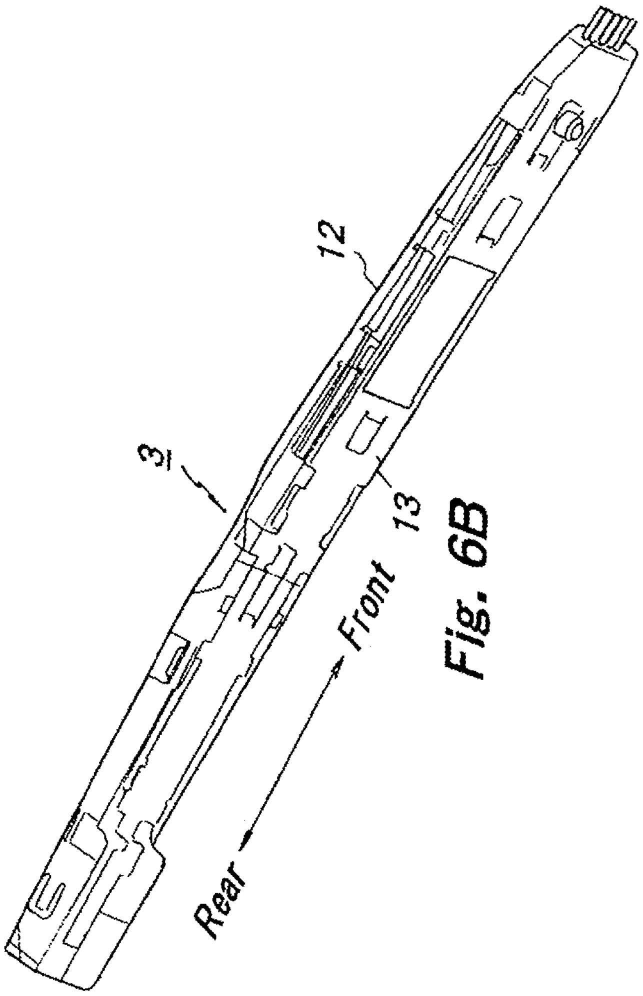

Thereafter, the third assembly U3 formed by integrally attaching the lock sensor plate 14, the circuit board 16, the unlock sensor plate 13, and the antenna 15 is placed in an unillustrated mold to be molded. Consequently, the antenna unit 3 integrally formed with the molded resin 12 as shown in FIGS. 6A and 6B are obtained. Note that in the antenna unit 3 configured in such a manner, the lock sensor plate 14 and the unlock sensor plate 13 are exposed from the surface of the molded resin 12.

When being attached in the aforementioned manner, the antenna unit 3 is accommodated in the recessed part 4*a* of the handle body 4 of the door handle 2. When the handle cover 7 is attached to the handle body 4 as shown in FIG. 1, the antenna unit 3 is supported in such a manner that the end portions thereof in the longitudinal direction are held between the handle body 4 and the handle cover 7. Specifically, the supporting protrusions 12*a* integrally formed with the inward surface of the end portions, of the molded resin 12, in the longitudinal direction are in contact with the handle body 4, while the supporting protrusions 12*b* integrally formed with the outward surface are in contact with the handle cover 7. In the center portion thereof in the longitudinal direction, the spaces are formed between the antenna unit 3 and the handle body 4 and between the antenna unit 3 and the handle cover 7 to prevent the antenna unit 3 from contacting the inner surfaces of the handle body 4 and the handle cover 7.

In this embodiment, the third assembly U3 formed by integrally attaching the lock sensor plate 14, the circuit board 16, unlock sensor plate 13, and the antenna 15 is placed in the mold to be molded into a unit. Thus, these components do not have to be placed in a mold separately but can be placed as a unit in the mold. The assembly efficiency is enhanced, and consequently the manufacturing cost can be kept low. In addition, since the lock sensor plate 14 is directly positioned and fixed on the circuit board 16, and the circuit board 16 and the antenna 15 are directly positioned and fixed on the unlock sensor plate 13, an additional member such as a positioning plate is not required. This reduces the number of parts, and thus can reduce the manufacturing cost.

In this embodiment, the surface of the unlock sensor plate 13 is coated with the insulative coating film. Even though the antenna 15 is directly fixed on the unlock sensor plate 13, electrical insulation therebetween can be ensured. Note that instead of coating the surface of the unlock sensor plate 13 with the insulative coating film, an insulative adhesive tape such as a PC sheet may be placed between the unlock sensor plate 13 and the antenna 15 to enable electrical insulation therebetween.

Further, in this embodiment, at the time of assembling, the harnesses 17 connected to the circuit board 16 can be held at a certain position by the holding plates 13*d*, the holding flanges 13*e*1, 13*e*2, and the partitioning plates 13*g*1, 13*g*2, which are formed in the unlock sensor plate 13. Thus, the harnesses 17 do not hinder another electronic part (antenna 15) from being mounted on the unlock sensor plate 13. The workability is improved, so that assembling efficiency is enhanced. In addition, the harnesses 17 can be accommodated reliably in the molded resin 12 when the third assembly U3 is lastly molded. This can reliably protect the harnesses 17 and prevent damage thereto.

Keeping the manufacturing cost low due to the improvement of the assembling efficiency of the antenna unit 3 as described above leads to achievement of cost reduction of the door handle device 1 including the antenna unit 3 incorporated therein.

What is claimed is:

1. An antenna unit incorporated into a door handle of a vehicle, said antenna unit comprising:

a first detection electrode of a capacitive sensor configured to detect a user's approaching or touching the door handle; and an antenna for wireless communications, said antenna provided directly on the first detection electrode, wherein a front side portion of the first detection electrode facing away from said vehicle comprises an antenna fixing part, said antenna fixing part comprising a locking claw and positioning plate designed to position and mechanically fix the antenna directly on the first detection electrode, a rear side portion of the first detection electrode comprises a circuit board fixing part for positioning and fixing a circuit board, the antenna fixed on the antenna fixing part and the first detection electrode are integrated into a unit with a molded resin, and the first detection electrode is provided with a harness holding part for holding a harness extending from the circuit board.

2. The antenna unit according to claim 1, wherein a surface of the first detection electrode is coated with an insulative coating film.

3. The antenna unit according to 1, further comprising:

a detection circuit of the capacitive sensor mounted on the circuit board; and a second detection electrode of the capacitive sensor, wherein an electrode fixing part for positioning and fixing the second detection electrode is provided on an opposite surface of the circuit board from a surface on which the first detection electrode is arranged.

4. The antenna unit according to claim 3, wherein the harness holding part is connected to the circuit board.

5. A door handle device comprising the antenna unit according to claim 1 which is incorporated into a door handle of a vehicle.

6. The antenna unit according to claim 2, further comprising:

a detection circuit of the capacitive sensor is mounted on the circuit board; and a second detection electrode of the capacitive sensor, wherein an electrode fixing part for positioning and fixing the second detection electrode is provided on an opposite surface of the circuit board from a surface on which the first detection electrode is arranged.

7. A door handle device comprising the antenna unit according to claim 2 which is incorporated into a door handle of a vehicle.

8. A door handle device comprising the antenna unit according to claim 3 which is incorporated into a door handle of a vehicle.

9. A door handle device comprising the antenna unit according to claim 4 which is incorporated into a door handle of a vehicle.

10. The antenna unit according to claim 1, wherein the antenna fixing part comprises three locking claws and two positioning plates.

* * * * *